(12) United States Patent
Chen et al.

(10) Patent No.: US 9,059,148 B2
(45) Date of Patent: Jun. 16, 2015

(54) CONTACT STRUCTURE

(71) Applicant: Taiwan Semiconductor Manufacturing Company, Ltd., Hsin-Chu (TW)

(72) Inventors: Meng-Tse Chen, Changzhi Township (TW); Wei-Hung Lin, Xinfeng Township (TW); Kuei-Wei Huang, Hsin-Chu (TW); Chih-Wei Lin, Xinfeng Township (TW); Chih Chun Chiu, Zhudong Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 13/972,664

(22) Filed: Aug. 21, 2013

(65) Prior Publication Data
US 2013/0334710 A1 Dec. 19, 2013

Related U.S. Application Data

(63) Continuation of application No. 13/291,882, filed on Nov. 8, 2011, now Pat. No. 8,586,408.

(51) Int. Cl.
H01L 23/48 (2006.01)
H01L 23/52 (2006.01)
H01L 29/40 (2006.01)
H01L 23/31 (2006.01)
H01L 23/498 (2006.01)
H01L 21/56 (2006.01)
H01L 21/48 (2006.01)
H01L 25/10 (2006.01)
H01L 23/00 (2006.01)

(52) U.S. Cl.
CPC ............ H01L 23/48 (2013.01); H01L 23/3121 (2013.01); H01L 23/49816 (2013.01); H01L 21/561 (2013.01); H01L 24/16 (2013.01); H01L 2924/15321 (2013.01); H01L 21/4853 (2013.01); H01L 2224/16227 (2013.01); H01L 25/105 (2013.01); H01L 2225/1023 (2013.01); H01L 2225/1058 (2013.01); H01L 2224/16225 (2013.01)

(58) Field of Classification Search
CPC ............................ H01L 23/48; H01L 23/3121
USPC ........................... 257/777, E21.502, E23.116
See application file for complete search history.

(56) References Cited

U.S. PATENT DOCUMENTS

| 5,765,744 | A | 6/1998 | Tatumi et al. |
| 6,245,595 | B1 | 6/2001 | Nguyen et al. |
| 6,352,878 | B1 | 3/2002 | Mostafazadeh et al. |
| 6,744,131 | B1 * | 6/2004 | Hoang et al. ................... 257/704 |
| 6,987,031 | B2 | 1/2006 | Eng et al. |

(Continued)

*Primary Examiner* — David S Blum
(74) *Attorney, Agent, or Firm* — Slater & Matsil, L.L.P

(57) ABSTRACT

A system and method for forming contacts is provided. An embodiment comprises forming the contacts on a substrate and then coining the contacts by physically shaping them using, e.g., a molding chamber. The physical shaping of the contacts may be performed using a patterned portion of the molding chamber or else by placing a patterned stencil around the contacts prior before a force is applied to physically reshape the contacts. The contacts may be reshaped into a cylindrical, oval, cuboid, or rectangular shape, for example.

20 Claims, 12 Drawing Sheets

(56) References Cited

U.S. PATENT DOCUMENTS

| | | |
|---|---|---|
| 7,134,194 B2 | 11/2006 | Brandenburg et al. |
| 7,808,112 B2 | 10/2010 | Boon |
| 7,851,259 B2 | 12/2010 | Kim |
| 7,863,096 B2 * | 1/2011 | England ............... 438/108 |
| 7,875,230 B2 | 1/2011 | Silverbrook |
| 7,883,936 B2 | 2/2011 | Palaniappan et al. |
| 8,003,515 B2 * | 8/2011 | Meyer et al. ............ 438/622 |
| 8,188,585 B2 | 5/2012 | Brunnbauer et al. |
| 8,278,746 B2 | 10/2012 | Ding et al. |
| 8,461,679 B2 * | 6/2013 | Lee et al. ............... 257/737 |
| 8,492,262 B2 * | 7/2013 | Gruber et al. .......... 438/613 |
| 8,822,323 B2 * | 9/2014 | Sakamoto et al. ....... 438/612 |
| 2001/0040290 A1 * | 11/2001 | Sakurai et al. .......... 257/737 |
| 2002/0066952 A1 | 6/2002 | Taniguchi et al. |
| 2003/0193093 A1 | 10/2003 | Brofman et al. |
| 2004/0058472 A1 | 3/2004 | Shim |
| 2008/0085595 A1 * | 4/2008 | Li ........................... 438/612 |
| 2009/0206461 A1 | 8/2009 | Yoon |
| 2010/0072600 A1 | 3/2010 | Gerber |
| 2010/0237482 A1 | 9/2010 | Yang et al. |
| 2010/0244208 A1 | 9/2010 | Pagaila et al. |
| 2011/0092066 A1 | 4/2011 | MacKay |
| 2011/0165733 A1 | 7/2011 | Haba et al. |
| 2011/0241193 A1 * | 10/2011 | Ding et al. .............. 257/686 |
| 2011/0291274 A1 * | 12/2011 | Meyer et al. ............ 257/738 |
| 2012/0104595 A1 | 5/2012 | Haba et al. |
| 2012/0104607 A1 * | 5/2012 | Weng ....................... 257/738 |
| 2012/0299181 A1 | 11/2012 | Chen et al. |
| 2012/0309130 A1 | 12/2012 | Hin et al. |
| 2013/0001776 A1 * | 1/2013 | Yu et al. ................. 257/738 |
| 2013/0087915 A1 * | 4/2013 | Warren et al. ........... 257/738 |

* cited by examiner

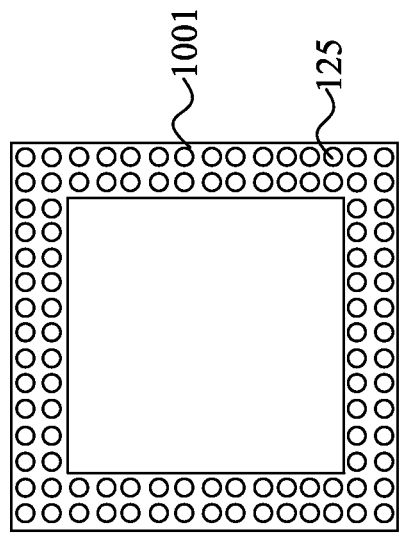
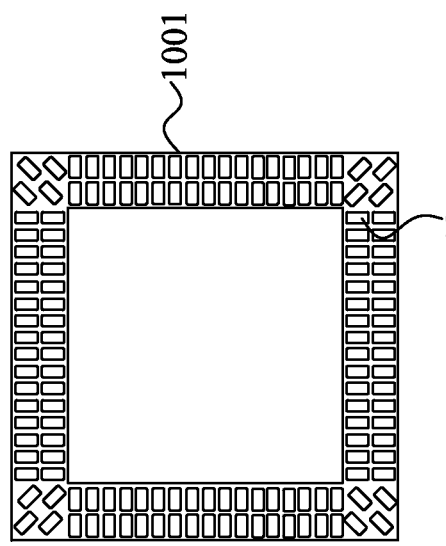
Fig. 10A
Fig. 10B
(Prior Art)

CONTACT STRUCTURE

This application is a continuation of U.S. patent application Ser. No. 13/291,882, now U.S. Pat. No. 8,586,408, filed on Nov. 8, 2011, and entitled "Contact and Method of Formation," which application is hereby incorporated herein by reference.

BACKGROUND

Generally, in a Package on Package (PoP) system individually semiconductor dies may be packaged either separately (or with multiple semiconductor dies in each separate package), and then the separate packages may be brought together and interconnected so that the individual semiconductor dies in the separate packages may be integrated together in order to perform a desired tasks. The individual packages may be electrically interconnected to each other, for example, by using contact bumps.

Such contact bumps may be formed by initially forming a layer of the contact material onto a substrate of the package. Once the layer of the contact material has been formed, the layer of contact material may be reflowed, by which the temperature of the contact material is increased in order to at least partially liquefy the contact material. This partial liquification allows the contact material to pull itself into a ball shape using its own surface tension.

Once formed, the contact bumps of one package may be placed into contact with contact pads from another package. Alternatively, the contact bumps may be placed into contact with other types or forms of contacts formed on the other package. Once the contact bumps have been aligned with their appropriate locations, the contact bumps may again be reflowed and reheated in order to again partially liquefy them and cause them to partially flow and form a bridge between the two packages. Once the contact bumps cool down and resolidify, the contact bumps are fully joined to each other. This joint between the contact bumps allows for both a physical connection between the contact bumps as well as an electrical connection that allows signals and power to cross from one package to another, thereby allowing the two packages to be integrated with each other and work together.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 10A-10B compare the placement of coined contacts and non-coined contacts in accordance with an embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a coining method for a package on package system. The embodiments may also be applied, however, to other conductive contacts.

Figure 1:
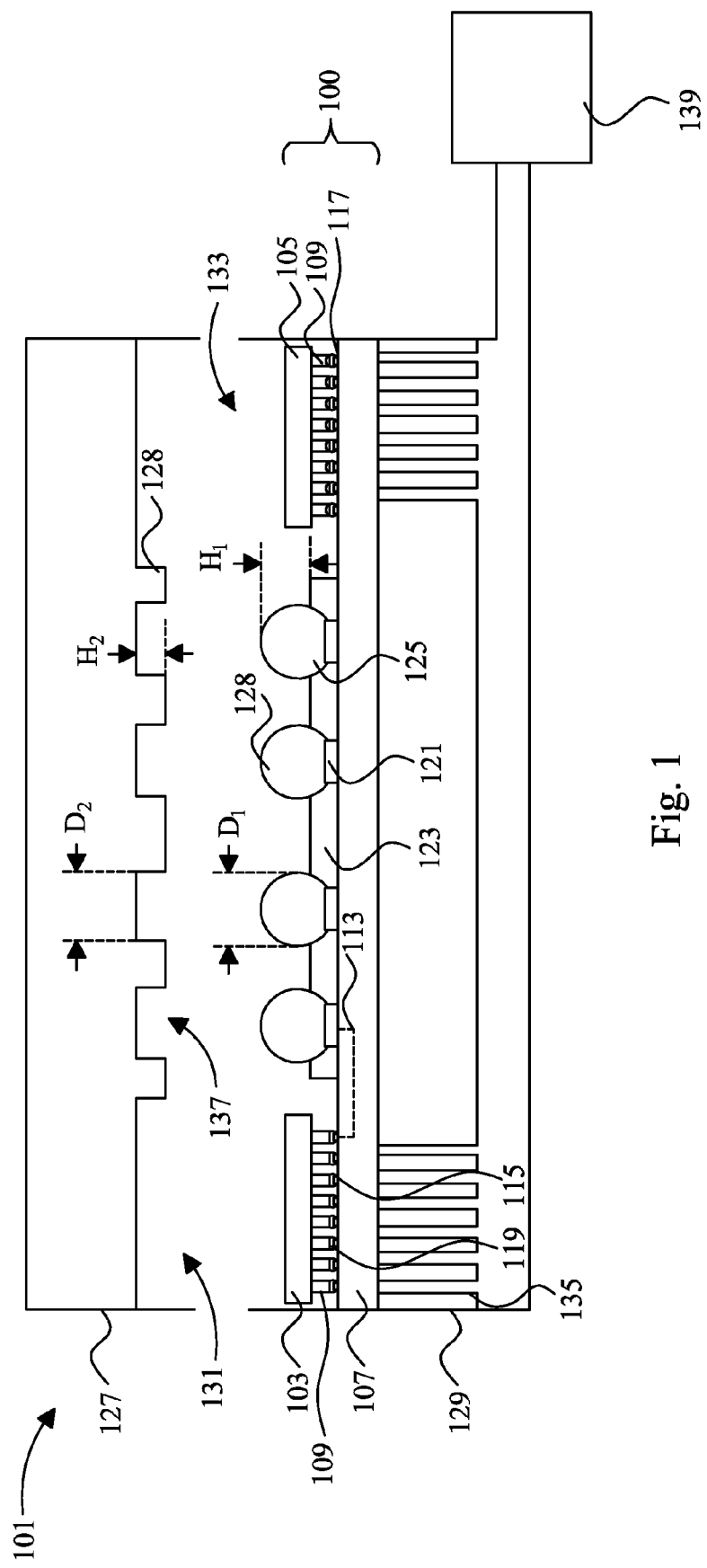
FIG. 1 illustrates a semiconductor system in a molding chamber in accordance with an embodiment.

With reference now to FIG. 1, there is shown a semiconductor system 100 within a molding chamber 101. The semiconductor system 100 may comprise a first die 103 and a second die 105 bonded to a substrate 107. The first die 103 may comprise a semiconductor die upon which various active and passive devices (such as transistor, resistors, capacitors, inductors, and the like) have been formed in order to create a functional device. The first die 103 may also comprise an alternating series of conductive and dielectric layers over the active and passive devices in order to interconnect and isolate the various devices and to form functional circuitry.

Additionally, in order to connect the functional circuitry to an external device (e.g., the substrate 107), the first die 103 may also have a first set of contacts 109 along one side of the first die 103. The first set of contacts 109 may be a conductive material, such as copper, and may be, e.g., in the shape of a conductive pillar. The first set of contacts 109 may be formed utilizing, e.g., a photolithographic and plating process, forming the first set of contacts 109 in electrical contact with the underlying conductive layers and the active and passive devices in order to provide the external contact for these active and passive devices. However, the first set of contacts 109 are not intended to be limited to copper pillars, as any suitable type of contact, such as aluminum contact pads, solder bumps, wire bond pads, or the like, may alternatively be utilized.

The second die 105 may, similar to the first die 103, be a semiconductor die upon which a second set of active devices and passive devices have been formed in order to provide a similar or different functionality from the first die 103. In an embodiment the second die 105 may operate cooperatively (through, e.g., the substrate 107) with the first die 103 in order to perform a desired task, although the second die 105 may also operate independently from the first die 103. The second die 105 may also comprise a series of alternating conductive layers and dielectric layers utilized to interconnect the active and passive devices, and may also have a second set of contacts 111 similar to the first set of contacts 109 (e.g., copper pillars, aluminum contact pads, wire bond pads, etc.) that may be utilized to connect the second die 105 to external devices, such as the substrate 107.

The substrate 107 may be utilized to support and protect the first die 103 and the second die 105 while also being used to provide a connection between the contacts on the first die 103 and the contact on the second die 105 to external devices. In an embodiment substrate 107 may be a laminate substrate formed as a stack of multiple thin layers (or laminates) of a polymer material such as bismaleimide triazine (BT), FR-4, or the like. However, any other suitable substrate, such as an organic substrate, a ceramic substrate, or the like, may alternatively be utilized, and all such redistributive substrate that provide support and connectivity to the first die 103 and the second die 105 are fully intended to be included within the scope of the embodiments.

The substrate 107 may additionally have a third set of contacts 115 and a fourth set of contacts 117 located along a first side of the substrate 107 in order to connect to the first set of contacts 109 and the second set of contacts 111, respectively. The third set of contacts 115 and the fourth set of contacts 117 may be, e.g., conductive pillars, similar to the first set of contacts 109 and the second set of contacts 111 on the first die 103 and the second die 105, although they may also be different types of connectors. Any suitable method of providing a point for electrical connection to the substrate 107 may alternatively be used, and all such alternatives are fully intended to be included within the scope of the embodiments.

The first set of contacts 109 (located on the first die 103) may be connected to the third set of contacts 115 (located on the substrate 107) using, e.g., a bonding process. In an embodiment the bonding process may comprise forming or otherwise placing a connecting material 119, such as solder, on the first set of contacts 109, the third set of contacts 115, or both. The first set of contacts 109 and the third set of contacts 115 may then be placed in contact with each other (with the connecting material 119 between them) and the connecting material 119 may be reflowed in order to bond the first set of contacts 109 to the third set of contacts 115 and also to bond the first die 103 to the substrate 107.

The second set of contacts 111 (located on the second die 105) may similarly be connected to the fourth set of contacts 117 using, e.g., a similar bonding process. For example, the connecting material 119 may be formed on the second set of contacts 111, the fourth set of contacts 117, or both, and the connecting material 119 may be reflowed after the second set of contacts 111 and the fourth set of contacts 117 have been placed in contact with each other (with the connecting material 119 between them). Once the connecting material 119 has been cooled, the connecting material 119 provides both a physical and electrical connection between the second die 105 and the substrate 107.

However, as one of ordinary skill in the art will immediately recognize, the above description of the first set of contacts 109, the second set of contacts 111, the third set of contacts 115, and the fourth set of contacts 117 and their respective connections to each other is merely one illustrative embodiment and is not intended to be limiting. Rather, any suitable method of physically and electrically connecting the first die 103 and the second die 105 to the substrate 107, such as utilizing contact pads and solder bumps or microbumps, or utilizing wire bonds, may alternatively be utilized. These and any other suitable methods and materials are fully intended to be included within the scope of the embodiments.

The substrate 107 may also comprise conductive lines (represented in FIG. 1 by the single dashed line 113) that may be used to route signal, power and ground connections to and from the first die 103 and the second die 105. In an embodiment in which the substrate 107 is a laminate substrate, the conductive lines 113 may be metallization layers and vias formed within the different layers of the laminates in order to route the connections as desired. The conductive lines 113 may alternatively route the connections utilizing a conductive adhesive, conductive traces, bond wires, metal lands, combinations of these, or the like.

The conductive lines 113 may route the electrical connections between the first die 103 and the second die 105, or may route the connections from the first die 103 or the second die 105 to one of a number of contact pads 121. The contact pads 121 may be formed (e.g., prior to the bonding of the first die 103 and the second die 105) of a conductive material such as aluminum, although other suitable materials, such as copper, tungsten, or the like, may alternatively be utilized. The contact pads 121 may be formed using a process such as CVD, although other suitable materials and methods may alternatively be utilized. Once the material for the contact pads 121 has been deposited, the material may be shaped into the contact pads 121 using, e.g., a photolithographic masking and etching process.

After the contact pads 121 have been formed, a passivation layer 123 may be formed to help isolate and protect the contact pads 121. In an embodiment the passivation layer 123 may be formed from a polymer such as polyimide, or may alternatively be formed of materials such as silicon oxides, silicon nitrides, low-k dielectrics, extremely low-k dielectrics, combinations of these, and the like. The passivation layer 123 may be formed to have a thickness of between about 2 µm and about 15 µm, such as about 5 µm.

Once the passivation layer 123 has been formed, package contacts 125 may be formed through the passivation layer 123 in order to connect to the underlying contact pads 121. In an embodiment a portion of the contact pads 121 may be exposed by initially forming an opening through the passivation layer 123 using, e.g., a suitable photolithographic and etching process. Once an opening has been made, first conductive material 128 may be formed through the openings in contact with the package contacts 125.

The first conductive material 128 may comprise a material that may be physically molded while also being conductive. In an embodiment, the first conductive material 128 may be a reflowable solder material such as tin, or other suitable materials, such as silver, lead-free tin, or copper. In an embodiment in which the first conductive material 128 is tin, the first conductive material 128 may be formed by initially forming a layer of the tin through such commonly used methods such as plating, etc., to a thickness of between about 10 µm and about 30 µm, such as about 15 µm.

Once the first conductive material 128 has been formed through the passivation layer 123, a reflow process may be performed to transform the first conductive material 128 into a bump shape. In the reflow process the temperature of the first conductive material 128 is raised to between about 200° C. and about 260° C., such as about 250° C., for between about 10 seconds and about 60 seconds, such as about 35 seconds. This reflow process partially liquefies the first conductive material 128, which then pulls itself into the desired bump shape due to the first conductive material's 128 surface tension.

In an embodiment the package contacts 125 may be 0.25 mm solder balls, which have a first diameter $D_1$ of between about 230 µm and about 270 µm, such as about 250 µm. Additionally, the package contacts 125 may be in the shape of a ball, and may have a first height $H_1$ from the passivation layer 123 of between about 180 µm and about 210 µm, such as about 200 µm. As such, the package contacts 125 may extend above the first die 103 and the second die 105.

The molding chamber 101 may comprise a first top molding portion 127 and a bottom molding portion 129 separable from the first top molding portion 127. The first top molding portion 127 may have a first cavity 131 while the bottom molding portion 129 may have a second cavity 133. When the first top molding portion 127 is lowered to be adjacent to the bottom molding portion 129, the first cavity 131 and the second cavity 133 may fit together to form a third cavity 201 (not illustrated in FIG. 1 but illustrated in FIG. 2 below).

The first top molding portion 127 additionally has a pattern formed into the surface facing the first cavity 131, with protrusions 128 extending from the surface to form the pattern. In an embodiment the pattern is formed so as to coin and reshape the package contacts 125 when the first top molding portion 127 is brought together with the bottom molding portion 129. The pattern may form a series of individual coining cavities 137, which are shaped into the eventual desired shape of the package contacts 125 and which are aligned with the pattern of package contacts 125 on the substrate 107. In an embodiment the individual coining cavities 137 may have a cylindrical shape with a third diameter $D_3$ between about 10% to 30% greater than the first diameter $D_1$, and a second height $H_2$ of between about −20% to 20% of a height between a top surface of the first die 103 to a top surface of the substrate 107.

The first top molding portion 127, along with the protrusions 128 used to form the individual coining cavities 137, may be made of a material that will not react or otherwise alter the package contacts 125 during the encapsulation process, while also being strong enough to withstand the coining process while also coining the package contacts 125. In an embodiment the first top molding portion 127 may be a material such as steel. However, the first top molding portion 127 is not limited to steel, and may be any other suitable material, such as high chromium (Cr) steel combinations of these, or the like. These and any other materials are fully intended to be included within the scope of the embodiments.

The bottom molding portion 129 may have vacuum holes 134 which may be connected to a vacuum pump 139 in order to reduce the pressure and generate at least a partial vacuum within the vacuum holes 134. When the semiconductor system 100 is placed adjacent to the vacuum holes 134, this at least partial vacuum will lower the pressure in order to fix and hold the semiconductor system 100, thereby assuring that, once the semiconductor system 100 is correctly positioned within the first cavity 131, the semiconductor system 100 will not move during subsequent processing, such as the encapsulation process. Additionally, once the first top molding portion 127 has been lowered into connection with the bottom molding portion 129, the vacuum holes 134 may also be utilized to remove material and to lower the pressure within the third cavity 201.

Figure 2A:
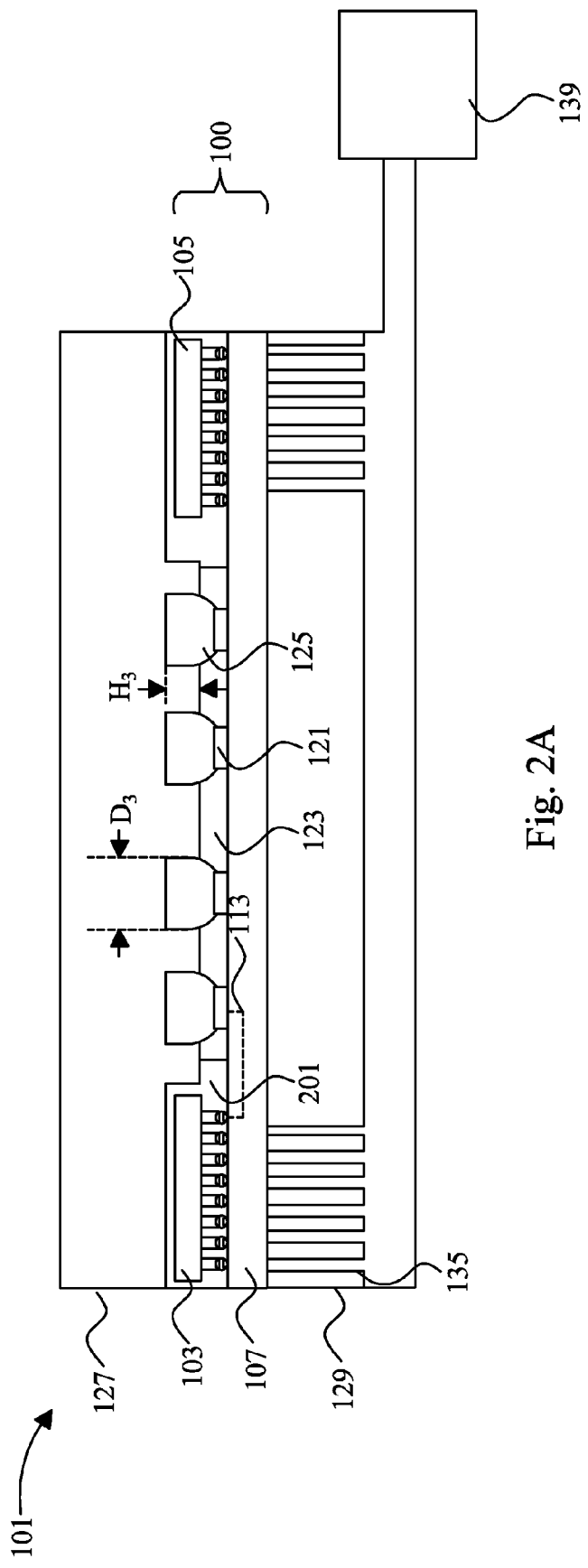
FIGS. 2A-2D illustrate a coining process in accordance with an embodiment.

FIG. 2A illustrates the coining process of reshaping the package contacts 125, in which the first top molding portion 127 and the bottom molding portion 129 are brought together, with the first top molding portion 127 also coming into physical contact with the package contacts 125. In an embodiment the first top molding portion 127 may be brought down onto the package contacts 125 with a clamp force sufficient to physically reshape the package contacts 125 to a desired shape, such as of between about 1 ton and about 10 ton, such as about 5 ton.

This coining process may be performed without the package contacts 125 being partially liquefied in, e.g., a reflow process. As such, the coining process may be performed at a temperature below the melting point of the package contacts 125. In an embodiment in which the package contacts 125 are solder, the coining process may be performed at a temperature between about 50° C. and about 100° C. below the melting point of the solder.

When the first top molding portion 127 is brought together with the bottom molding portion 129 with such force, the package contacts 125 will deform under the pressure and reshape to fit the shape of the individual coining cavities 137 in which they are located. In an embodiment in which the individual coining cavities 137 are shaped as cylinders, the package contacts 125 will deform into a cylindrical shape in order to reshape into the shape of the individual coining cavities 137.

Figure 2D:
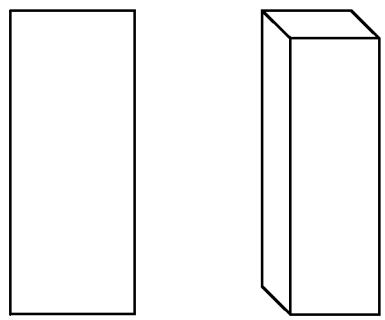
Figure 2C:
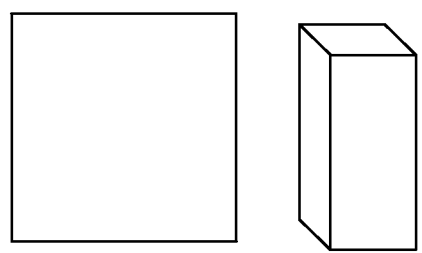
Figure 2B:
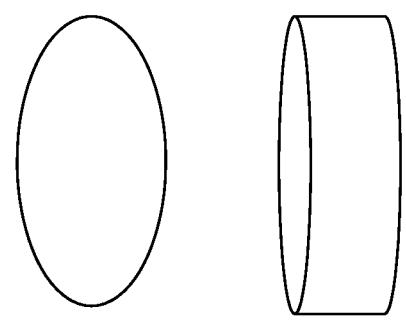

However, the cylindrical shape is not the only shape that may be utilized, and the embodiments are not intended to be limited to forming cylindrical shapes. FIGS. 2B-2D illustrate a plan view and a side view of other shapes into which the package contacts 125 may be coined, with FIG. 2B illustrating an oval shape, FIG. 2B illustrating a square shape, and FIG. 2D illustrating a rectangular shape. These shapes and any other suitable shapes that allow the package contacts 125 to connect to external devices, are fully intended to be included within the scope of the embodiments.

Returning to FIG. 2A, when the package contacts 125 are coined into a cylindrical shape, the newly reshaped package contacts 125 may have a fourth diameter $D_4$ of between about 275 μm and about 320 μm, such as about 300 μm. Additionally, the original first height $H_1$ of the package contacts 125 may be reduced to a third height $H_3$ of between about 120 μm and about 140 μm, such as about 130 μm. This reduction in height will also allow for an external device (e.g., a second package 601 discussed below with respect to FIG. 6) to be connected closer to the substrate 107, thereby allowing for an overall reduction in height of a package on package (PoP) system.

Additionally, the precise height of the package contacts 125 may be tuned as desired to obtain a specific height and diameter of the package contacts 125. For example, if the package contacts 125 have an original diameter of 250 μm, and the package contacts 125 are reshaped into a cylindrical shape with a height of 120 μm, the package contacts 125 may have a diameter of 295 μm. Alternatively, if the package contacts 125 are reshaped into a cylindrical shape with a height of 130 μm, the package contacts 125 may have a diameter of 283 μm, and if the package contacts 125 are reshaped into a cylindrical shape with a height of 140 μm, the package contacts 125 may have a diameter of 273 μm. Such tuning allows the package contacts 125 to be shaped as desired for size and spacing considerations on the substrate 107.

Figure 3:
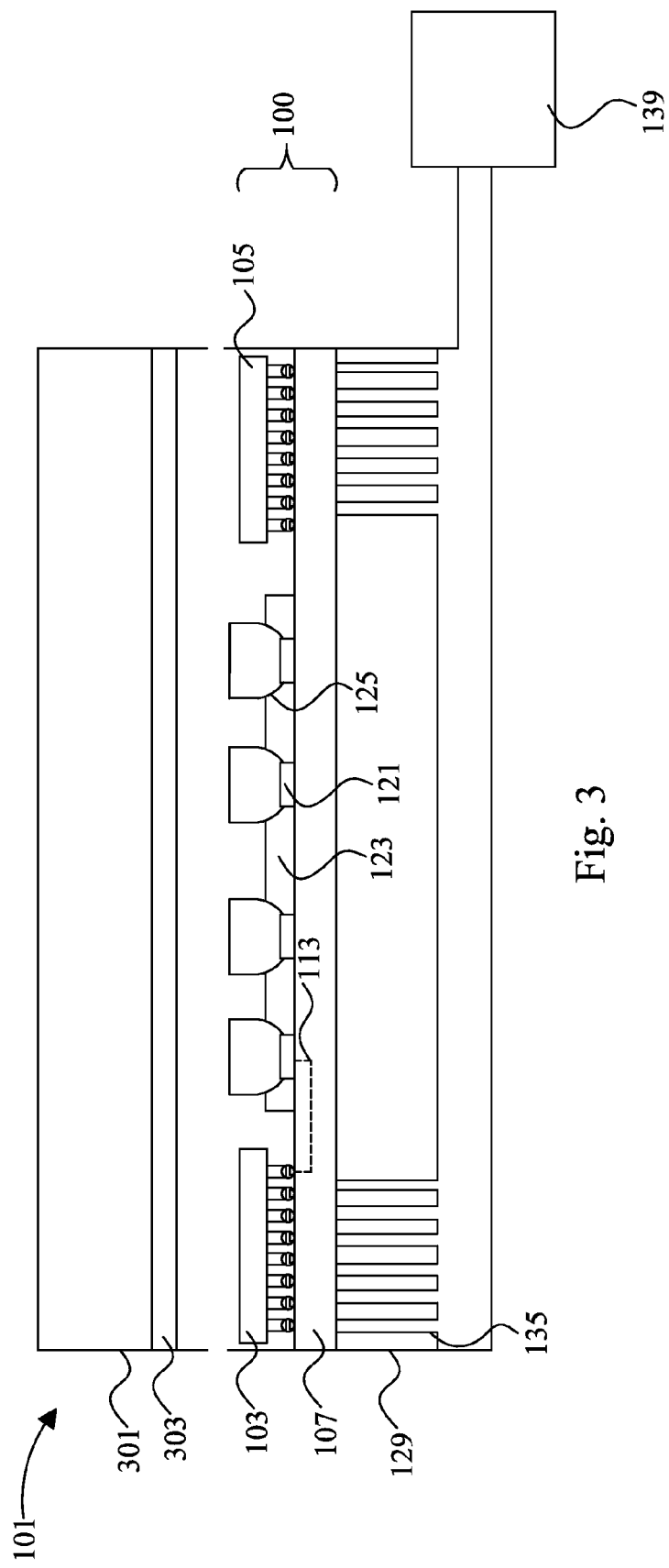
FIG. 3 illustrates the result of the coining process in accordance with an embodiment.

FIG. 3 illustrates the separation of the first top molding portion 127 (with the pattern for the individual coining cavities 137) from the bottom molding portion 129. After the package contacts 125 have been coined into a new shape by the first top molding portion 127, the first top molding portion 127 may be separated from the bottom molding portion 129, leaving the package contacts 125 having their new shape (e.g., cylindrical), instead of their original ball shape, and ready to be encapsulated. In an embodiment the encapsulation may be performed in the same molding chamber 101 in which the coining was performed. However, in order to not have the pattern (located in the first top molding portion 127) also be a part of the encapsulation process, the first top molding portion 127 may be removed from the molding chamber 101 and replaced with a second top molding portion 301. Different from the first top molding portion 127, the second top molding portion 301 may have a surface, such as a flat surface, which will shape the top surface of an encapsulant 401 during the encapsulation process. When the second top molding portion 301 is engaged with the bottom molding portion 129, the two will form a molding cavity 403 (not illustrated in FIG. 3 but illustrated in FIG. 4).

Alternatively, instead of replacing the first top molding portion 127, the semiconductor system 100 may be removed from the molding chamber 101 altogether and placed into a second molding chamber (not individually shown). The second molding chamber may have the second top molding portion 301, with, e.g., the flat surface, which will shape a top surface of the encapsulant 401 during the encapsulation process. Either method of removing the pattern of the individual coining cavities 137 (e.g., changing the first top molding portion 127 to the second top molding portion 301 or using a separate molding chamber) may be used, and both are fully intended to be included within the scope of the embodiments.

Additionally, a release film 303 may be positioned to be located between the second top molding portion 301 and the semiconductor system 100. The release film 303 may be a material that allows the encapsulant 401 to not stick, or be released from, the surface of the molding cavity 403 once the semiconductor system 100 has gone through the encapsulating process. The release film 303 may comprise, e.g., polyimide, vinyl chloride, PC, ETFE, PTFE, PET, FEP, polyvinylidene chloride, fluorine-containing glass cloth, synthetic paper, metallic foil, combinations of these, and the like. The release film 303 may have a thickness between about 20 µm and about 50 µm, such as about 25 µm.

Figure 4:
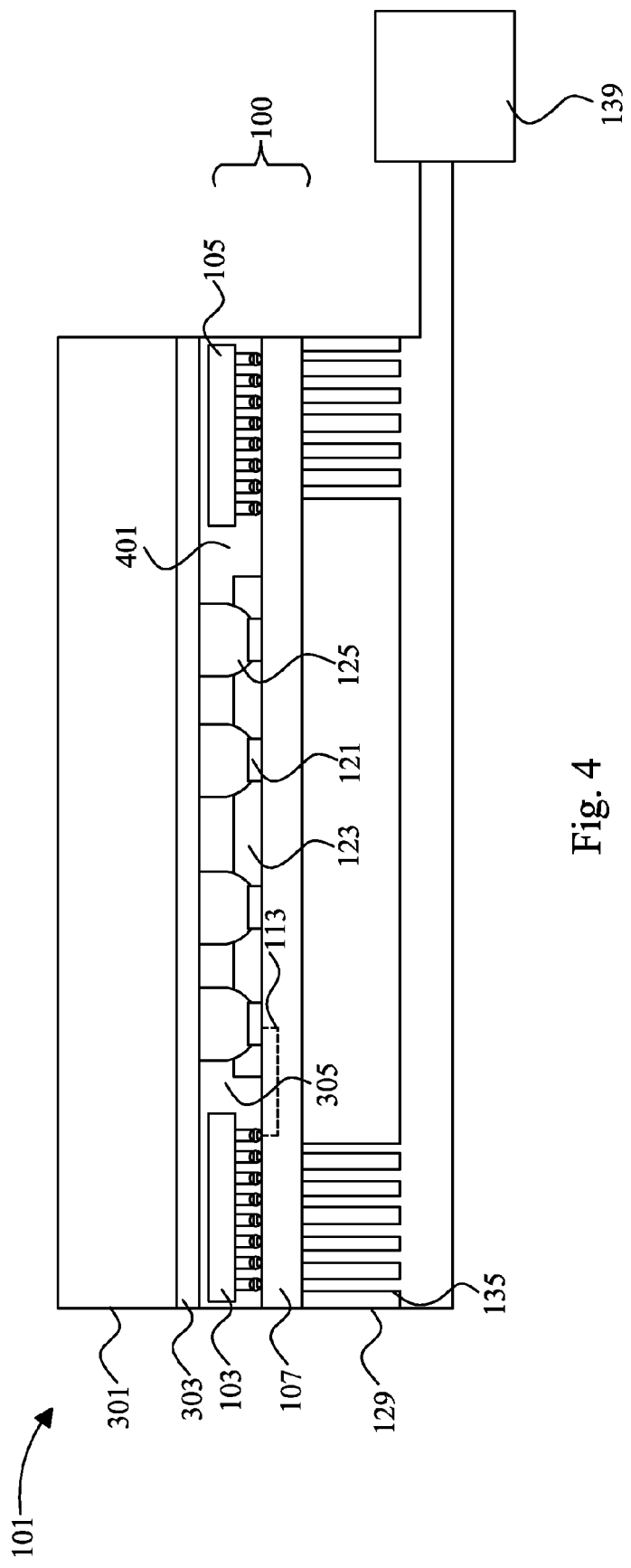
FIG. 4 illustrates an encapsulation process in accordance with an embodiment.

FIG. 4 illustrates that, once the second top molding portion 301 has been placed over the semiconductor system 100, the second top molding portion 301 may be placed adjacent to the bottom molding portion 129, thereby enclosing the semiconductor system 100 within the molding cavity 403. Once enclosed, the second top molding portion 301 and the bottom molding portion 129 (along with the release film 303 sandwiched between them) may form an airtight seal in order to control the influx and outflux of gasses from the molding cavity 403. The second top molding portion 301 and the bottom molding portion 129 may be pressed together using, e.g., a compression tool and a force of between about 5 KN and about 200 KN, such as between about 50 and 100 KN.

Also illustrated in FIG. 4 is the placement of an encapsulant 401 within the molding cavity 403. The encapsulant 401 may be a resin such as polyimide, PPS, PEEK, PES, a heat resistant crystal resin, combinations of these, or the like. The encapsulant 401 may be placed within the molding cavity 403 prior to the alignment of the second top molding portion 301 and the bottom molding portion 129, or else may be injected into the molding cavity 403 through an injection port (not shown).

Once the encapsulant 401 has been placed into the molding cavity 403 such that the encapsulant 401 encapsulates the semiconductor system 100, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing process, such as irradiation or even allowing the encapsulant 401 to harden at ambient temperature, may alternatively be used. Any suitable curing process may be used, and all such processes are fully intended to be included within the scope of the embodiments discussed herein.

Figure 5A:
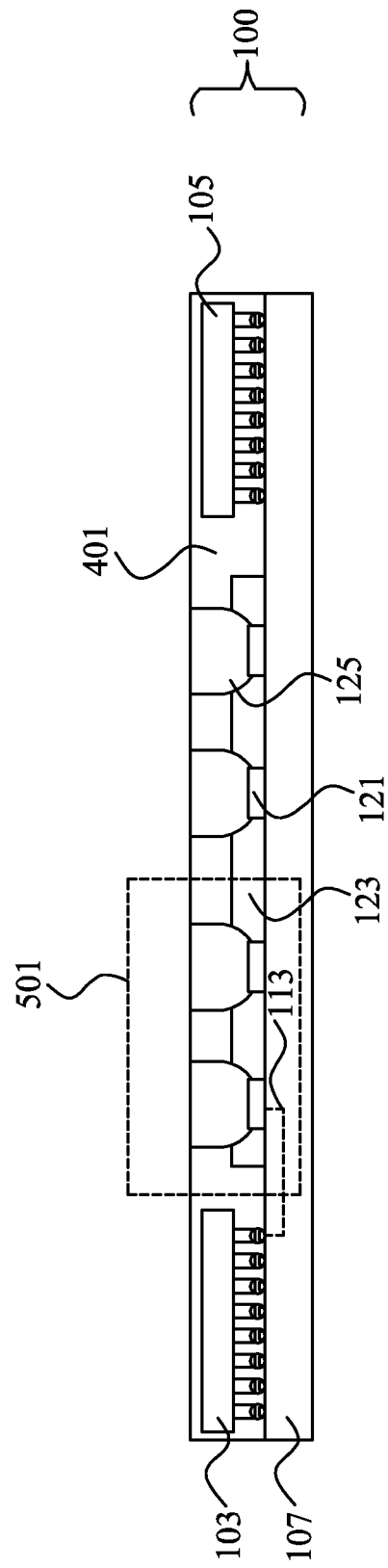
FIGS. 5A-5B illustrate the result of the encapsulation process in accordance with an embodiment.

FIG. 5A illustrates that, after the encapsulant 401 has been used to encapsulate the semiconductor system 100, the second top molding portion 301 may be removed from the bottom molding portion 129, and the semiconductor system 100 (with the encapsulant 401) may be removed from the molding chamber 101. In an embodiment, the second top molding portion 301 protected the coined package contacts 125 from being covered by the encapsulant 401 by being in physical contact with the package contacts 125 during the encapsulation process, thereby keeping the package contacts 125 exposed for external electrical connections (not shown in FIG. 5A).

Figure 5B:
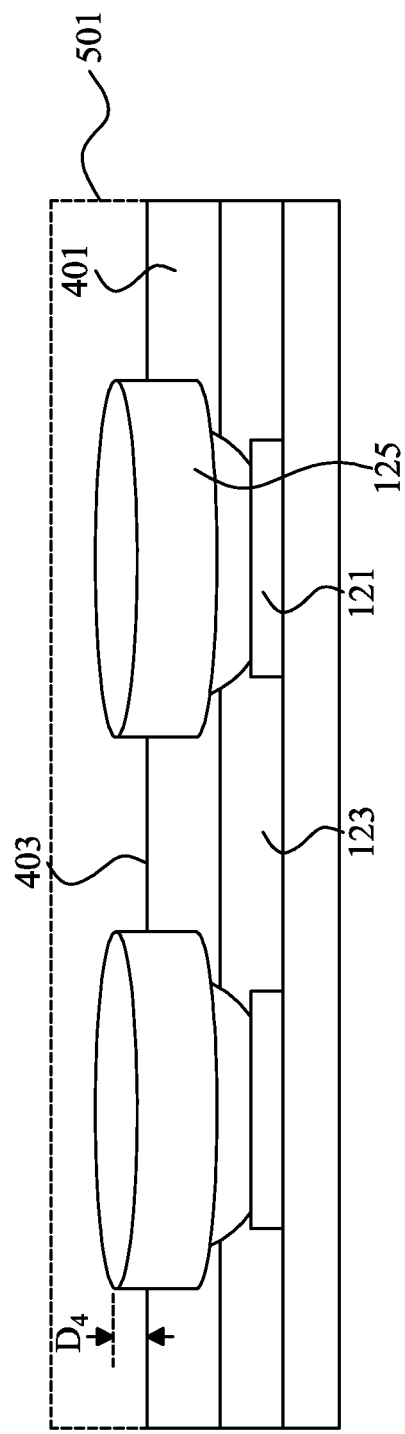

FIG. 5B illustrates a close-up view of a region of the semiconductor system 100 (illustrated in FIG. 5A by dashed line 501) that includes the package contacts 125 and the encapsulant 401 after the encapsulation process. As illustrated, the package contacts 125 have retained their cylindrical shapes that the package contacts 125 were forced into during the coining process (see, e.g., the discussion with respect to FIG. 2, making them shorter and wider than they had been).

As such, by coining the package contacts 125, the height of the package contacts 125 may be reduced while also forming a larger top surface area for the package contacts 125. Additionally, by reshaping the bump/ball shape into which the package contacts 125 were originally shaped, the ball/bump shape will not affect the placement of the encapsulant 401, which may be formed by the encapsulation process to have a planar top surface 403 instead of the conventional process's curved top surface.

With this planar top surface 403, the package contacts 125 may either be planar with the planar top surface 403 of the encapsulant 401. Alternatively, and as illustrated in FIG. 5B, the encapsulant 401 may be formed such that the package contacts 125 extend away from the planar top surface a first distance $D_5$ of about 0 µm to 50 µm. The encapsulant 401 may be formed such that the package contacts 125 extend away by reducing the pressure in the molding cavity 401 (utilizing, e.g., the vacuum pump 139) to a vacuum pressure of between about 0.1 torr and about 100 torr, such as about 10 torr.

Figure 6:
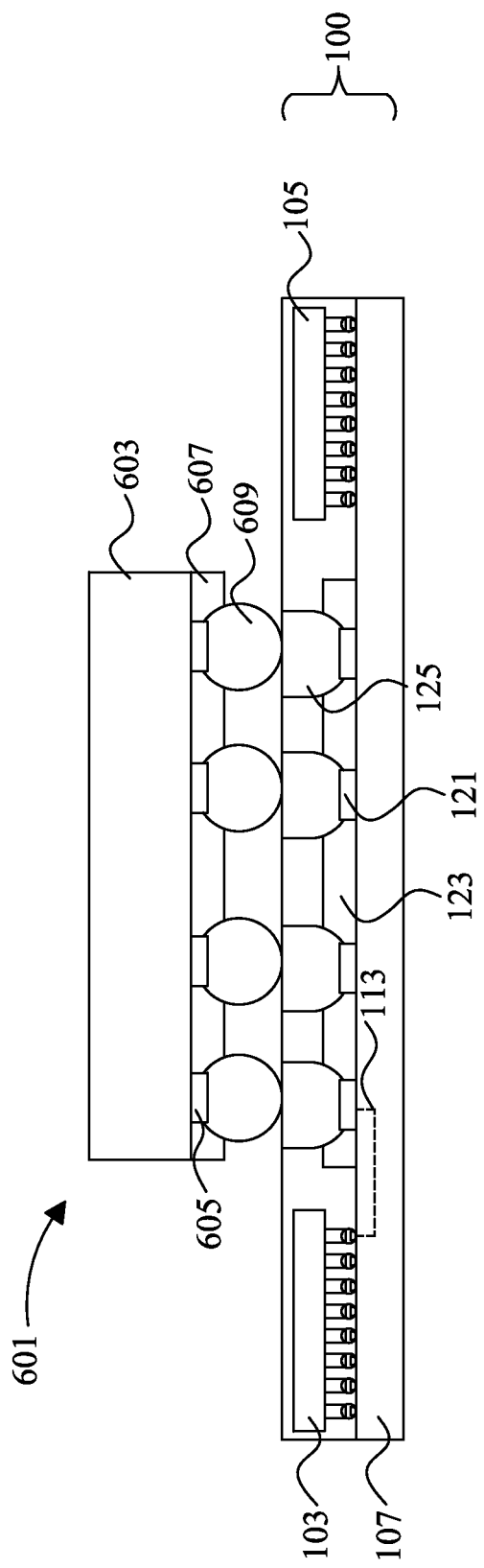
FIG. 6 illustrates the joinder of two packages in accordance with an embodiment.

FIG. 6 illustrates the placement of a second package 601 onto the semiconductor system 100, thereby creating a package on package (PoP) system. In an embodiment the second package 601 may comprise a second substrate 603, second contact pads 605, a second passivation layer 607, and a fifth set of contacts 609, and may also package a third die (not individually illustrated in FIG. 6). The second substrate 603, the second contact pads 605, the second passivation layer 607, and the fifth set of contacts 609 may be similar to the substrate 107, the contact pads 121, the passivation layer 123, and the third set of contacts 111 as described above with respect to the substrate 107. However, these elements are not limited to being the same, and any other suitable elements may alternatively be utilized.

In an embodiment in which the coined package contacts 125 and the fifth set of contacts 609 are solder, the second package 601 may be connected to the package contacts 125 of the semiconductor system 100 by aligning the fifth set of contacts 609 with the coined package contacts 125. Once the fifth set of contacts 609 has been aligned with the coined package contacts 125, the fifth set of contacts 609 may be reflowed in order to partially liquefy the fifth set of contacts 609 and the coined package contacts 125. Once the fifth set of contacts 609 and the coined package contacts 125 have cooled, the second package 601 has been bonded both physically and electrically with the packaged semiconductor system 100, thereby forming a PoP system.

However, as one of ordinary skill in the art will recognize, the above described process and structures for coined package contacts 125 in a PoP system is intended to be merely illustrative and is not intended to be limiting. The process and structures may be utilized in many of processes and structures, including individual dies, flip-chip structures, and the like. These and any other structures that may utilized coined contacts are fully intended to be included within the scope of the embodiments.

Figure 7:
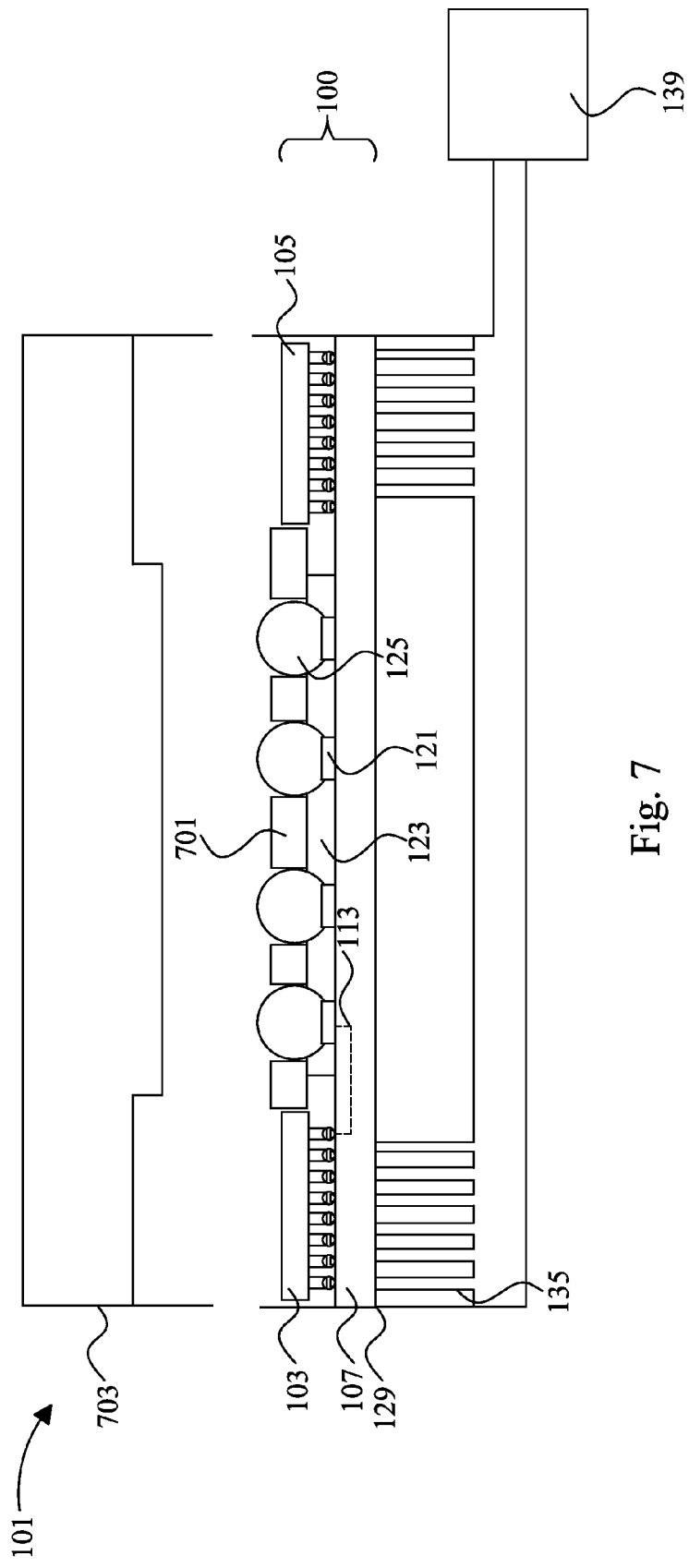
FIG. 7 illustrates a placement of a stencil in accordance with an embodiment.

FIG. 7 illustrates an alternative embodiment for the coining of the package contacts 125. In this embodiment, instead of having a pattern formed into the first top molding portion 127 (not illustrated in FIG. 7 but illustrated and discussed above with respect to FIG. 1), a stencil 701 may be utilized in connection with a flat surface of a third top portion 703 to form the pattern that will be used to coin the package contacts 125. The stencil 701 may be a material that will not react with the package contacts 125 but will also be strong enough to withstand and shape the package contacts 125 during the coining process. In an embodiment the stencil 701 may be steel, although any other suitable material, such as high chromium (Cr) steel, may alternatively be utilized.

The stencil 701 may have openings in the eventual shape desired for the package contacts 125. In an embodiment, the stencil 701 may have a thickness $T_1$ that is less than the first height $H_1$ of the package contacts 125, such as being between about 100 µm and about 170 µm, and may have openings that extend through the stencil 701. The openings may be in the eventually desired shape of the package contacts 125, such as cylindrical, rectangular, oval, etc.

Prior to the coining process, the stencil 701 may be placed between the package contacts 125. When placed, individual ones of the package contacts 125 desired to be reshaped may be located within individual ones of the openings through the stencil 701, with the package contacts 125 extending beyond the stencil 701. The placement of the stencil may be performed either manually or automatically as part of the coining process.

Figure 8:
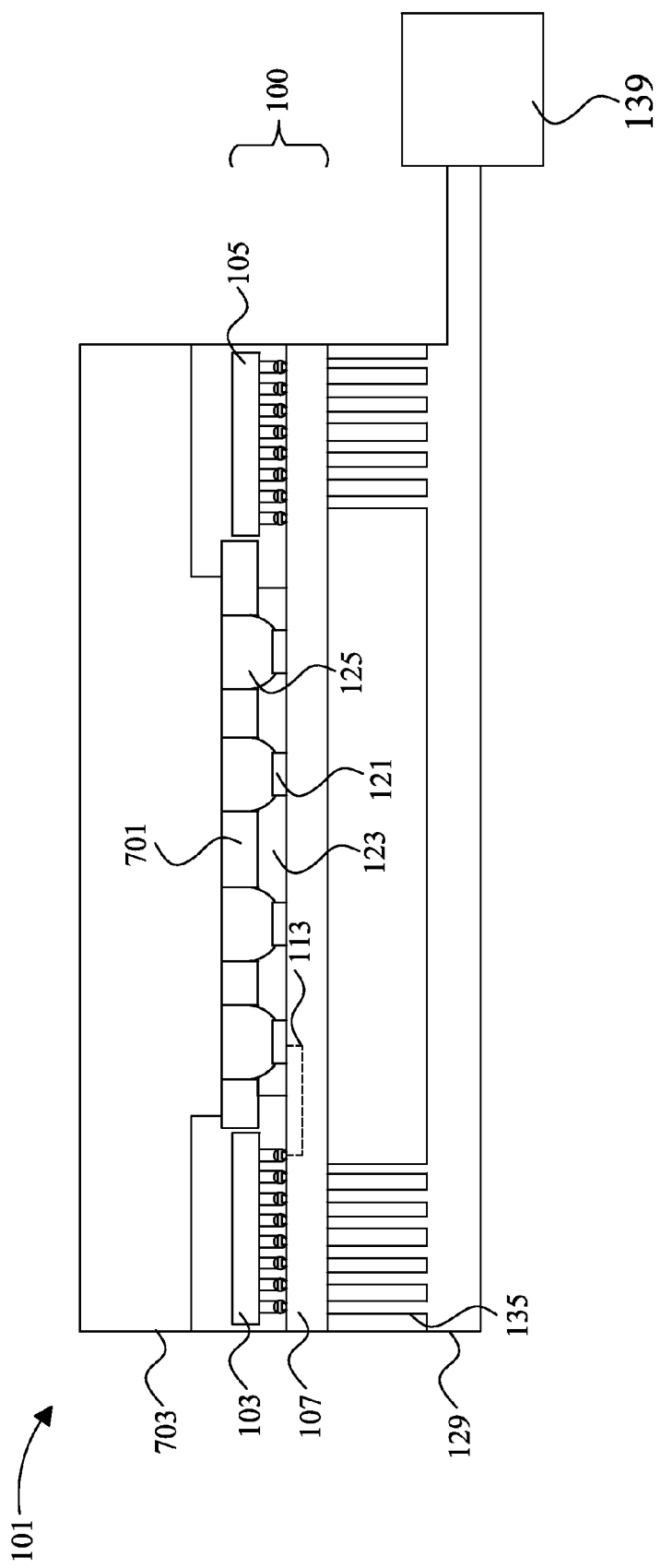
FIG. 8 illustrates a coining process utilizing the stencil in accordance with an embodiment.

FIG. 8 illustrates that, once the stencil 701 has been placed over the package contacts 125, a third top molding portion 703 may be engaged to coin the package contacts 125. In this embodiment, the third top molding portion 703, instead of having a patterned surface as like the first top molding portion 127 (described above with respect to FIG. 1), may instead have a flat surface, relying upon the stencil 701 to form the desired shape for the package contacts 125. Similar to the coining process described above with respect to FIG. 2, the third top molding portion 703 may be engaged to contact and press the package contacts 125 to physically reshape the package contacts 125 into the shape of the openings within the stencil 701, thereby coining the package contacts 125 into the desired shape.

Figure 9:
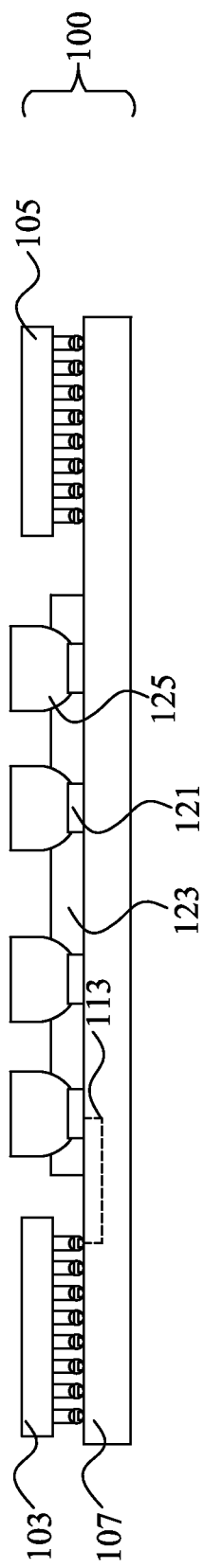
FIG. 9 illustrates the results of the coining process utilizing the stencil in accordance with an embodiment.

FIG. 9 illustrates that, after the package contacts 125 have been coined into their desired shapes, the third top molding portion 703 may be disengaged from the bottom molding portion 129 and the stencil 701 may be removed from between the package contacts 125, and the semiconductor system 100 may be removed from the molding chamber 101. The semiconductor system 100 may then be encapsulated, using either the same molding system with the third top molding portion 703 (as there is no need to replace the third top molding portion 703) or a second molding chamber (not individually illustrated in FIG. 7), with an encapsulant 401 as described above with respect to FIG. 4.

FIG. 10A illustrates a top down view of another embodiment in which the package contacts 125 may be formed and coined along an exterior of a third package 1001. In this embodiment the package contacts 125 were coined to have a rectangular shape. Additionally, by using the coining process to precisely control the shape of the package contacts 125, more package contacts 125 may be precisely located on the third package 1001 than otherwise obtainable.

As an illustration of this, FIG. 10B illustrates a prior art system utilizing a non-coined, ball shape for the package contacts 125, in the same general placement as the package contacts 125 illustrated in FIG. 10A. However, as is apparent from the figures, by coining the package contacts 125, their placement and shape may be more easily controlled, thereby allowing for a higher density of the package contacts 125. For example, as illustrated in the prior art FIG. 10B, only 104 of the package contacts 125 may be formed along the external edge of the third package 1001. However, by using the coining process, 148 of the package contacts 125 may be formed along the same external edge, thereby obtaining a significant increase in package contacts over the prior art.

Additionally, by utilizing the coining process described herein, the overall height of a PoP system may be controlled and reduced by controlling and reducing the height of the package contacts 125. For example, if the height of the package contacts 125 can be reduced by coining the package contacts 125, the overall height of the semiconductor system 100 may be reduced. With the overall height of the semiconductor system 100 reduced, the overall height of the PoP system into which the semiconductor system 100 is incorporated may similarly be reduced, thereby leading to a more efficient use of space and overall smaller devices.

In an embodiment, a method for manufacturing semiconductor devices comprising providing a contact on a substrate, the contact comprising a first material with a first melting point, is provided. A force is applied to physically reshape the contact at a temperature below the melting point.

In another embodiment, a method of manufacturing a semiconductor device comprising placing a substrate into a molding chamber, the substrate comprising a contact, is provided. The contact is reshaped utilizing the molding chamber, and the substrate is encapsulated after the reshaping the contact.

In yet another embodiment, a semiconductor device comprising a first die and a second die on a substrate is provided. An encapsulant is over the first die and the second die, and contacts extend through the encapsulant, wherein the contacts comprise a reflowable material and have a top surface that is planar.

Although the embodiments and their advantages have been described in detail, it should be understood that various changes, substitutions and alterations can be made herein without departing from the spirit and scope of the embodiments as defined by the appended claims. For example, the precise shape of the package contacts may be modified as needed by the overall design of the substrate. Additionally, the precise materials and processes used to coin the package contacts may also be modified while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
a first die and a second die on a substrate;
an encapsulant encapsulating the first die and the second die; and
contacts extending through the encapsulant, wherein the contacts comprise a reflowable material and have a top surface that is planar, at least one of the contacts having a sidewall, the sidewall comprising a first portion and a second portion, the first portion extending in a first direction away from the substrate and the second portion extending in a second direction away from the substrate, the second direction different from the first direction, wherein the second portion is straight and in contact with the encapsulant and the top surface and wherein the first portion is in contact with a passivation layer, wherein the passivation layer comprises a different material than the encapsulant.

2. The semiconductor device of claim 1, wherein the contacts comprise a cylindrical shape.

3. The semiconductor device of claim 1, further comprising a semiconductor package over and in electrical contact with the contacts.

4. The semiconductor device of claim 1, wherein the contacts comprise a cuboid shape.

5. The semiconductor device of claim 1, wherein the contacts comprise a rectangular shape.

6. The semiconductor device of claim 1, wherein the substrate is a laminate substrate.

7. The semiconductor device of claim 1, wherein the passivation layer encircles the first portion of the sidewall.

8. A semiconductor device comprising:
a first die bonded to a first side of a substrate;
a second die bonded to the first side of the substrate, wherein the substrate comprises a passivation layer;
an encapsulant fully surrounding the first die and the second die and in physical contact with the substrate; and
contacts extending through the encapsulant and at least partially into the passivation layer, wherein the contacts have a first shape within the passivation layer and a second shape different from the first shape within the encapsulant, wherein the contacts extend further from the substrate than the first die and the second die.

9. The semiconductor device of claim 8, wherein the contacts have a cylindrical shape.

10. The semiconductor device of claim 8, further comprising a semiconductor package over and in electrical contact with the contacts.

11. The semiconductor device of claim 8, wherein the contacts have a cuboid shape.

12. The semiconductor device of claim 8, wherein the contacts have a rectangular shape.

13. The semiconductor device of claim 8, wherein the substrate is a laminate substrate.

14. The semiconductor device of claim 8, wherein at least one of the contacts comprises a planar top surface and a sidewall perpendicular to the top surface, the sidewall being in physical contact with the encapsulant at a point adjacent to the top surface.

15. A semiconductor device comprising:
a passivation layer over a substrate;
a first semiconductor die attached to the substrate;
a second semiconductor die attached to the substrate;
contacts in electrical contact with and extending away from the substrate, the contacts laterally separated from the first semiconductor die and the second semiconductor die; and
a removable stencil surrounding the contacts and in contact with the passivation layer.

16. The semiconductor device of claim 15, wherein the contacts have a cylindrical shape.

17. The semiconductor device of claim 15, wherein the contacts have a cuboid shape.

18. The semiconductor device of claim 15, wherein the contacts have a rectangular shape.

19. The semiconductor device of claim 15, wherein the substrate is a laminate substrate.

20. The semiconductor device of claim 1, further comprising a semiconductor package over and in electrical connection with the contacts.

* * * * *